(12) United States Patent
Lin et al.

(10) Patent No.: US 8,066,113 B2
(45) Date of Patent: Nov. 29, 2011

(54) SEGREGATING APPARATUS

(75) Inventors: Yuan-Chi Lin, Hsin-Chu (TW);
Chih-Hung Hsieh, Hsin-Chu (TW); Bob Huang, Hsin-Chu (TW)

(73) Assignee: King Yuan Electronics Co., Ltd., Hsin-Chu (TW)

( * ) Notice: Subject to any disclaimer, the term of this patent is extended or adjusted under 35 U.S.C. 154(b) by 329 days.

(21) Appl. No.: 12/410,332

(22) Filed: Mar. 24, 2009

(65) Prior Publication Data
US 2010/0006398 A1 Jan. 14, 2010

(30) Foreign Application Priority Data
Jul. 11, 2008 (TW) .............................. 97126335 A

(51) Int. Cl.
*B65G 47/00* (2006.01)
(52) U.S. Cl. .................. 198/750.11; 294/106; 294/87.1; 209/617; 209/903
(58) Field of Classification Search .............. 198/468.2, 198/474.1, 750.11, 803.3; 294/87.1, 87.24, 294/106; 209/539, 541, 544, 617, 903, 912
See application file for complete search history.

(56) References Cited

U.S. PATENT DOCUMENTS

| | | | | |
|---|---|---|---|---|
| 5,460,476 A * | 10/1995 | Gazza | ........................... | 414/800 |
| 6,064,194 A * | 5/2000 | Farnworth et al. | ....... | 324/757.04 |
| 6,094,810 A * | 8/2000 | Schlatter et al. | ................. | 29/806 |
| 6,150,828 A * | 11/2000 | Farnworth et al. | ......... | 324/750.2 |
| 6,386,816 B1 * | 5/2002 | Urea et al. | ..................... | 414/453 |
| 6,520,319 B2 * | 2/2003 | Borsarelli et al. | ........ | 198/750.11 |
| 6,530,615 B2 * | 3/2003 | Filipiak et al. | .................. | 294/88 |
| 6,736,391 B1 * | 5/2004 | Reist | ............................. | 271/205 |
| 7,216,758 B2 * | 5/2007 | Hartness et al. | ........... | 198/803.7 |
| 7,455,167 B2 * | 11/2008 | Ludwig et al. | ............. | 198/345.2 |
| 7,472,937 B2 * | 1/2009 | Smith et al. | .................... | 294/106 |
| 7,566,197 B2 * | 7/2009 | Westendorf et al. | .......... | 414/729 |
| 7,837,247 B2 * | 11/2010 | Waldorf et al. | ............... | 294/116 |
| 7,878,336 B2 * | 2/2011 | Tsai et al. | ..................... | 209/552 |
| 7,887,108 B1 * | 2/2011 | Cawley et al. | .................... | 294/2 |

* cited by examiner

*Primary Examiner* — Douglas Hess
(74) *Attorney, Agent, or Firm* — Stout, Uxa, Buyan & Mullins, LLP

(57) ABSTRACT

An apparatus for segregating electronic components that engages and stops each of a plurality of electronic packages passing down a singulation tube is disclosed. In addition, the segregating apparatus is cable of segregating the electronic packages even though some of them had been linked together during the sealing process. The segregating apparatus includes a first swing arm to clip a electronic component, a second swing arm to clip another electronic component, and a third swing arm to depart the two electronic components, where all of components of the segregating apparatus are driven by a single driving force, reducing the size of the apparatus and the time needed for the segregating process.

20 Claims, 7 Drawing Sheets

SEGREGATING APPARATUS

BACKGROUND OF THE INVENTION

1. Field of the Invention

The present invention relates generally to semiconductor device segregating apparatus, and more specifically, to semiconductor device segregating apparatus capable of segregating a large number of semiconductor devices in a fast and efficient manner.

2. Description of the Prior Art

After the packaging process, singulation machines are commonly equipped with an off-loading apparatus for loading electronic packages into a tube, then the tube is transported to the inspection station for detecting the damaged electronic packages in order to assure quality.

As shown in FIG. 1, a tube 102 is mounted at an inclined angle so that electronic packages that have been fed into the tube 102 can slide under gravity one by one into a receptacle 112 installed in the lower end. The receptacle 112 is employed for storing the electronic packages after an inspection process is completed in an inspection zone 110. The electronic packages slide through a feed zone 104, then a separating device 108 including two pneumatic pistons 108a and 108b engages and stops each of the electronic packages. The area where the electronic packages are stopped is referred to as the holding zone 106. A plurality of electronic packages 103 (hereinafter referred to as DUT) is held in this area prior to entering the inspection zone 110.

After being horizontally inserted into the feed zone 104, the left end of the tube 102 is elevated in order to facilitate movement (e.g. sliding down) of the DUTs 103 under the pull of gravity. As shown in FIG. 2A, the DUT 103a nearest to the inspection zone 110 is engaged in the holding zone 106 by a stop 108a (hereinafter referred to as the first pneumatic piston), and consequently a sequence of DUTs is stopped in the holding zone 106. Then DUT 103b that is near DUT 103a is engaged by the other pneumatic piston 108b (hereinafter referred to as the second pneumatic piston), as shown in FIG. 2B. Finally, the first pneumatic piston 108a is drawn back resulting in the DUT 103a sliding to the inspection zone 110 under gravity. Similarly, other DUTs stopped in the holding zone 106 can slide to the inspection zone 110 one by one through repetition of the steps mentioned hereinbefore.

A number of improvements can be made to the separating device 108 shown in FIG. 1. For example, because excess sealing material 101 (shown in FIG. 3) causes the DUTs 103 to link together during the sealing process, they cannot be separated by the separating device 108, thereby jamming the holding zone 106; hence the equipment must be shut down to remove the linked DUTs, and time is wasted. In addition to the time of troubleshooting, multiple pneumatic pistons 108 require significant capital investment, a large working space, and especially extra time for separation of the DUTs 103. Accordingly, if the troubleshooting process can be eliminated, and if the working space and separating time can be reduced, costs associated with separating electronic packages can be decreased significantly.

SUMMARY OF THE INVENTION

In view of the foregoing, it is an object of the present invention to provide an apparatus that engages and stops each of a plurality of electronic packages passing down a tube. The apparatus includes a single driving force (e.g. driver) for driving one pneumatic piston thus reducing space of the apparatus and time of the process.

It is another object of the present invention to provide a segregating apparatus cable of segregating the electronic packages, some of which potentially had been linked together, thus eliminating the troubleshooting process and increasing the yield.

According to the objects, the present invention provides a segregating apparatus that includes a single driving force (e.g. driver) for driving a pedestal down, the pedestal being structured to drive three swing arms including a first swing arm, a second swing arm, and a third swing arm beneath it. The first swing arm is employed for driving a first finger set, which is capable of clipping a first DUT; the second swing arm is employed for driving a second finger set, which is capable of clipping a second DUT; and the third swing arm is employed for driving a first block and thus a second block to control a stop arm. In addition, the first block pushes the first finger forward to release the DUT that has been clipped by the first finger. The whole segregating process for separating the first DUT and the second DUT can be completed as follows: clipping the first DUT by the first finger; clipping the second DUT by the second finger; moving the first finger forward thus segregating the first DUT and the second DUT; releasing the first DUT and rising the stop arm for passage of the first DUT down and out of the segregating apparatus.

DESCRIPTION OF THE PREFERRED EMBODIMENT

A detailed description of the present invention will now be disclosed with reference to the following embodiments, which are not intended to limit the scope of the present invention, and which can be adapted for other applications. While the drawings are illustrated in detail, it is appreciated that the quantity of the disclosed components may be greater or less than that disclosed, except where the amount of components is expressly restricted.

Figure 1:
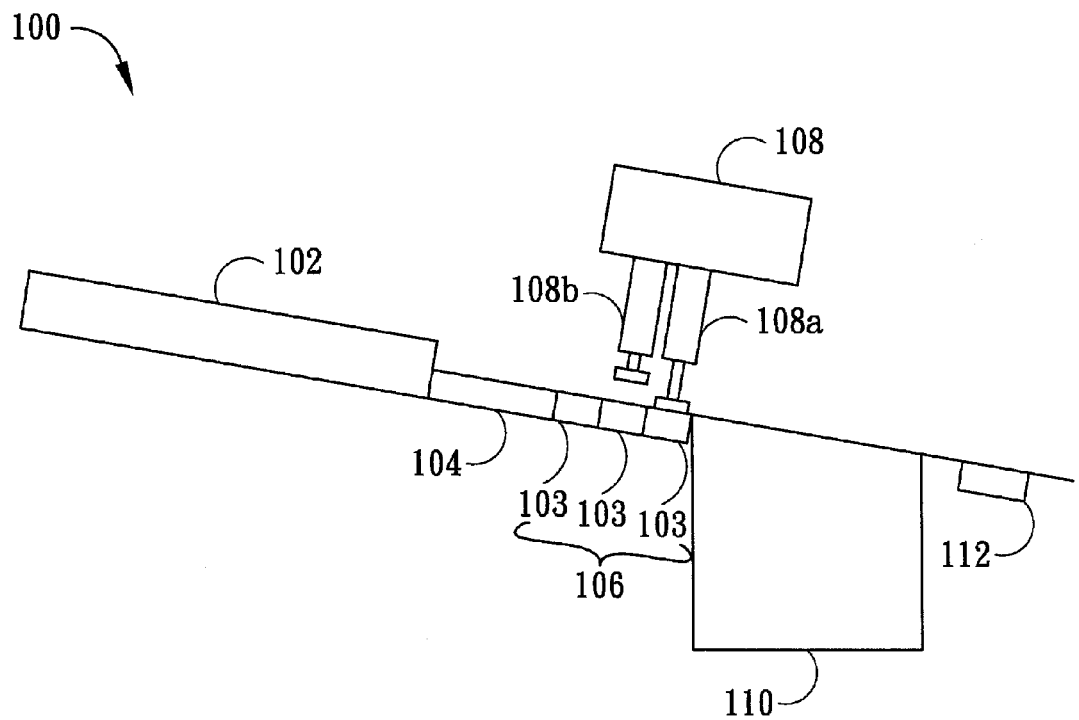
FIG. 1 illustrates an overall system diagram of a prior-art machine.
Figures 2A, 2B:
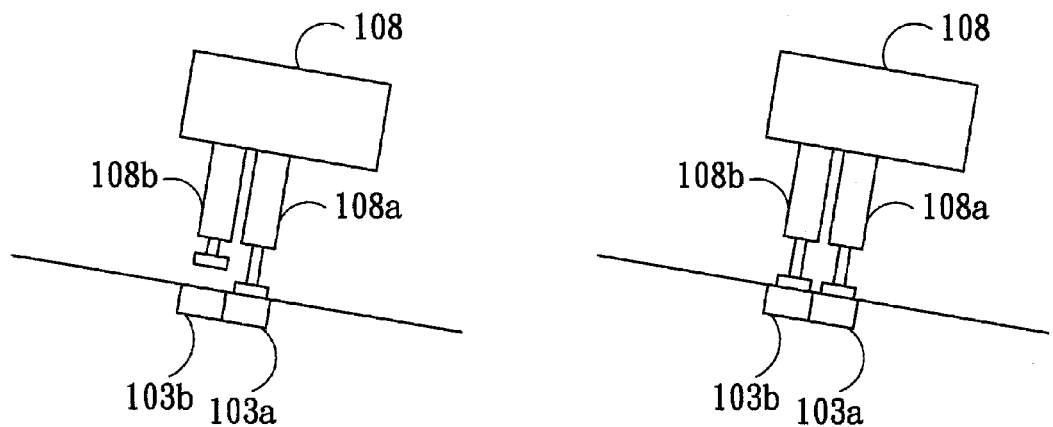
FIGS. 2A-2C illustrate diagrams of the first/second DUT being stopped or not stopped by the first/second pneumatic piston of a prior-art machine.
Figure 2C:
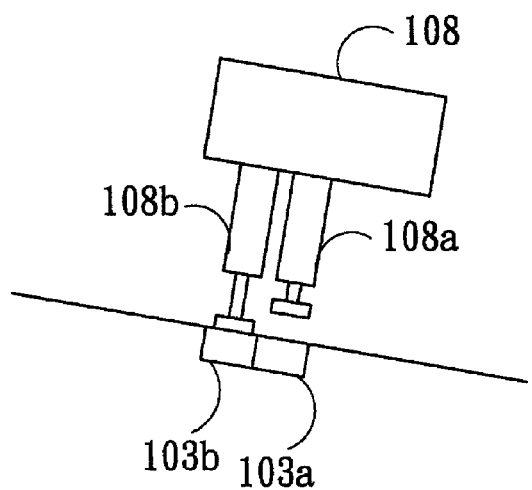
Figure 3:
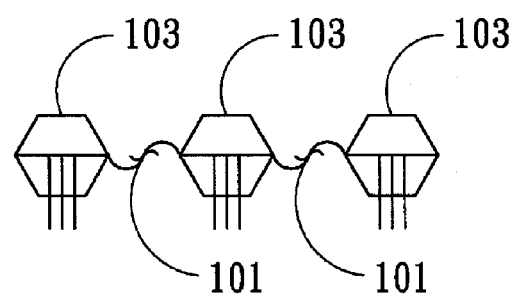
FIG. 3 provides a diagram of DUTs being linked together during the sealing process.
Figure 4A:
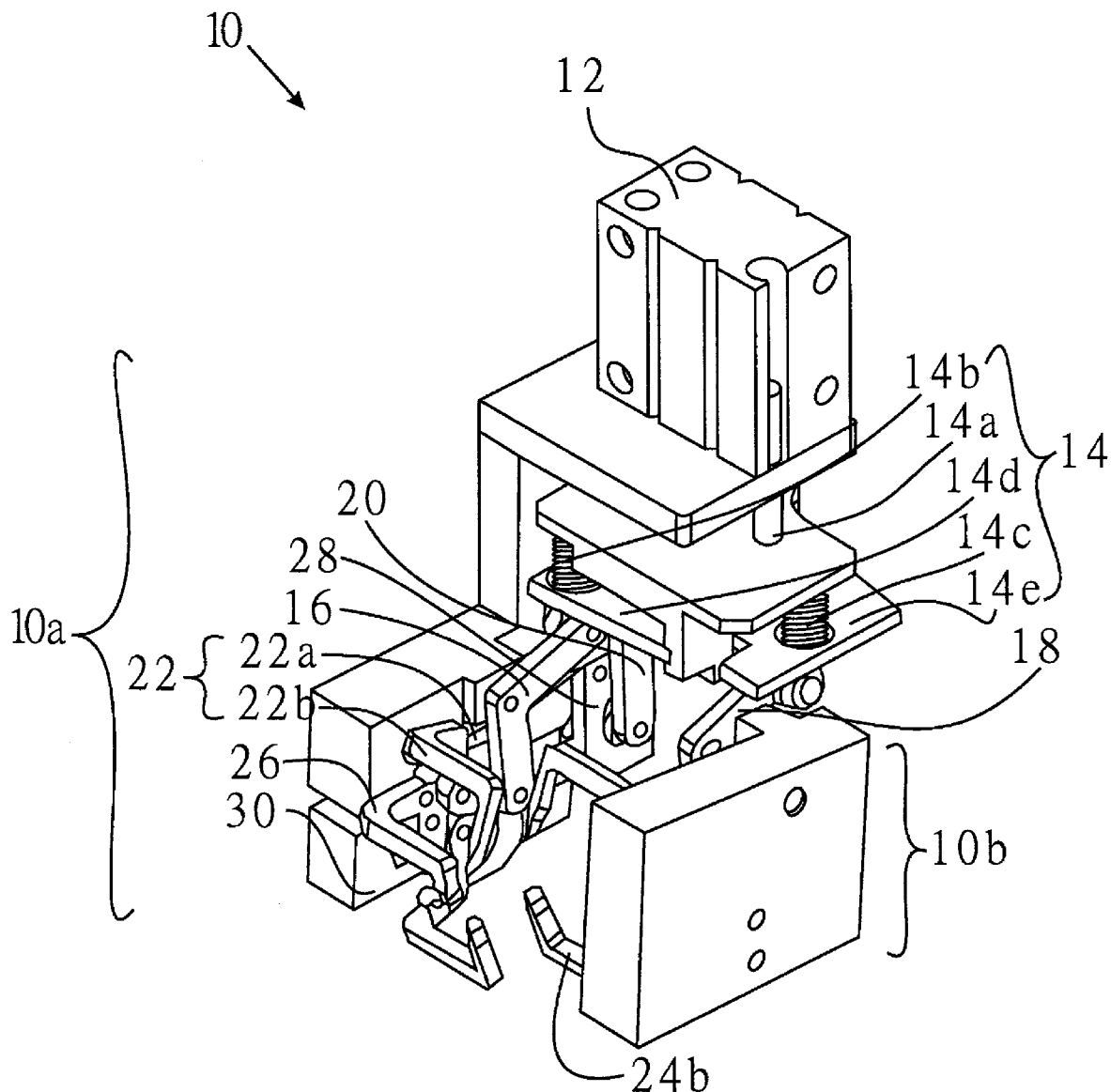
FIG. 4A is a front view of one embodiment including a segregating apparatus in accordance with the present invention.

FIGS. 4A-4D illustrate an embodiment according to the present invention. FIG. 4A is a front view of the embodiment. A segregating apparatus 10 for engaging and stopping each of a plurality of DUTs (e.g. electronic packages) passing down a tube includes a driving force (e.g. driver) 12 such as a pneumatic piston whose lower end connects to a pedestal 14, which comprises an upper support 14a, a first spring 14b, a second spring 14c, a first press 14d, and a second press 14e. The first press 14d and the second press 14e are coupled to the upper support 14a by the first spring 14b and the second spring 14c, respectively.

Figure 4B:
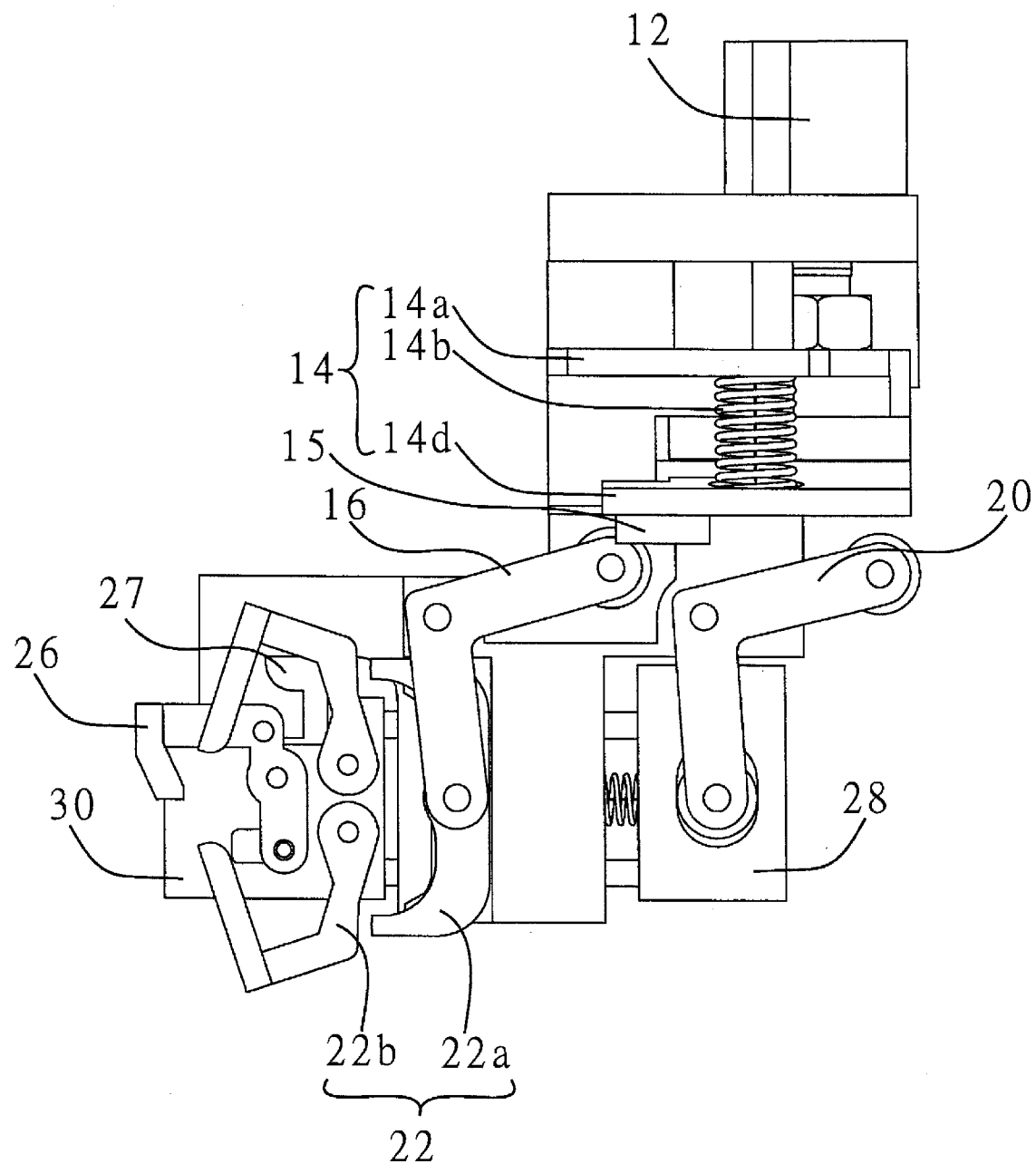
FIG. 4B is an enlarged side view of the segregating apparatus shown in 4A.
Figure 4C:
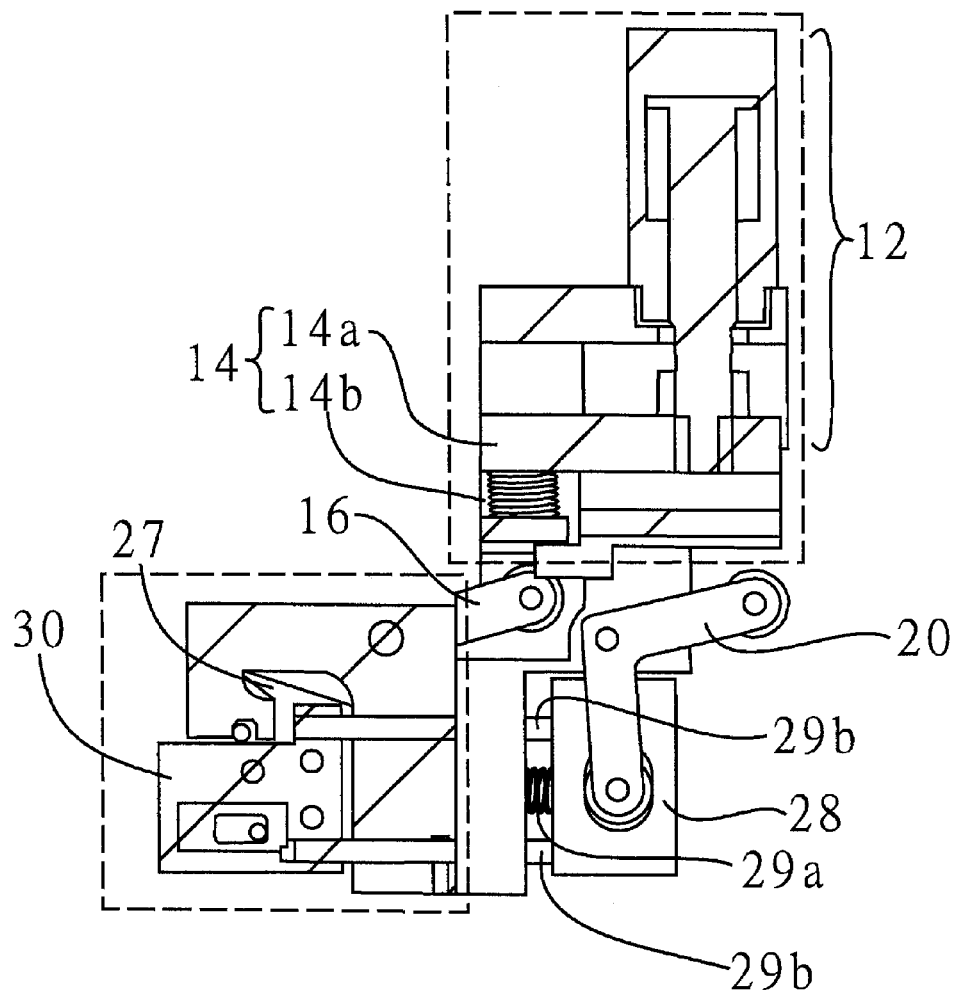
FIG. 4C is a section view of the structure depicted in FIG. 4B.

FIG. 4B is an enlarged side view of the segregating apparatus 10 shown in FIG. 4A, and FIG. 4C is a part section view of FIG. 4B, wherein the view is presented in two dashed rectangles. Both a first swing arm 16 and a third swing arm 20 are mounted under the first press 14d and are coupled to a first finger set 22 and a first block 28, respectively, wherein the first finger set includes a first controlling mechanism 22a and a first finger 22b, and the first controlling mechanism has the shape of an inverted U, V, or the like. The first swing arm 16 is capable of controlling the first finger 22b via the first controlling mechanism 22a. The third swing arm 20 is employed for pushing the first block 28 mounted behind the first swing arm 16, and the first block 28 is used for pushing the first finger 22b and a second block 30 via a third spring 29a and a bolt 29b, respectively, as shown in FIG. 4C. When the first finger 22b is pushed to a predetermined position, it will depart from the first controlling mechanism 22a and spread, thus releasing the DUT that has been clipped. Similarly, when the second block 30 is pushed to a predetermined position, a stop arm 26 mounted on the second block 30 will depart from a hook 27 and cause the stop arm 26 to rise. The stop arm 26 is installed between the segregating apparatus 10 and an inspection zone (not shown). The DUTs slide down to the inspection zone while the stop arm 26 is risen up, and are stopped in the segregating apparatus 10 while the stop arm 26 is hooked in the hook 27.

Figure 4D:
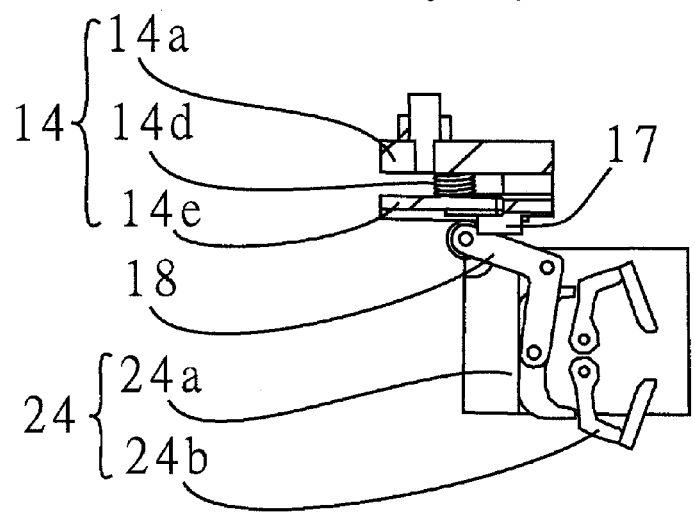
FIG. 4D is an enlarged side view of a second finger set of the present invention.

FIG. 4D is an enlarged side view of 10b shown in 4A. Similar to the first swing arm 16, a second swing arm 18 located under the second press 14e is coupled to a second finger set 24, which comprises a second controlling mechanism 24a and a second finger 24b, wherein the second controlling mechanism has the shape of an inverted U, V, or the like.

The segregating process according to the present invention is carried out with a sequence of steps. As mentioned hereinbefore, the driver 12 supplies the driving force to lower the first press 14d and the second press 14e at the same time by pressing the upper support 14a connected to the first spring 14b and the second spring 14c. Thus, the first press 14d presses the first swing arm 16 and the third swing arm 20 under it, and the second press 14e presses the second swing arm under it. The first swing arm 16, the second swing arm 18, and the third swing arm are originally at the same elevation. In order to accomplish pressing of the first swing arm 16 first, pressing of the second swing arm 18 second, and pressing of the third swing arm 20 third, the distance (gap) between the first press 14d and the first swing arm 16 is made shorter than the distance between the second press 14e and the second swing arm 18, and the distance between the second press 14e and the second swing arm 18 is made shorter than the distance between the first press 14d and the third swing arm 20. For example, this can be achieved by a first bump 15 being added between the first press 14d and the first swing arm 16 and a second bump 17 being added between the second press 14e and the second swing arm 18, wherein the first bump 15 has a volume larger than the volume of the second bump 17. Consequently the first swing arm 16 will be pressed first, the second swing arm 18 be pressed second, and the third. swing arm 20 be pressed third.

Figure 5:
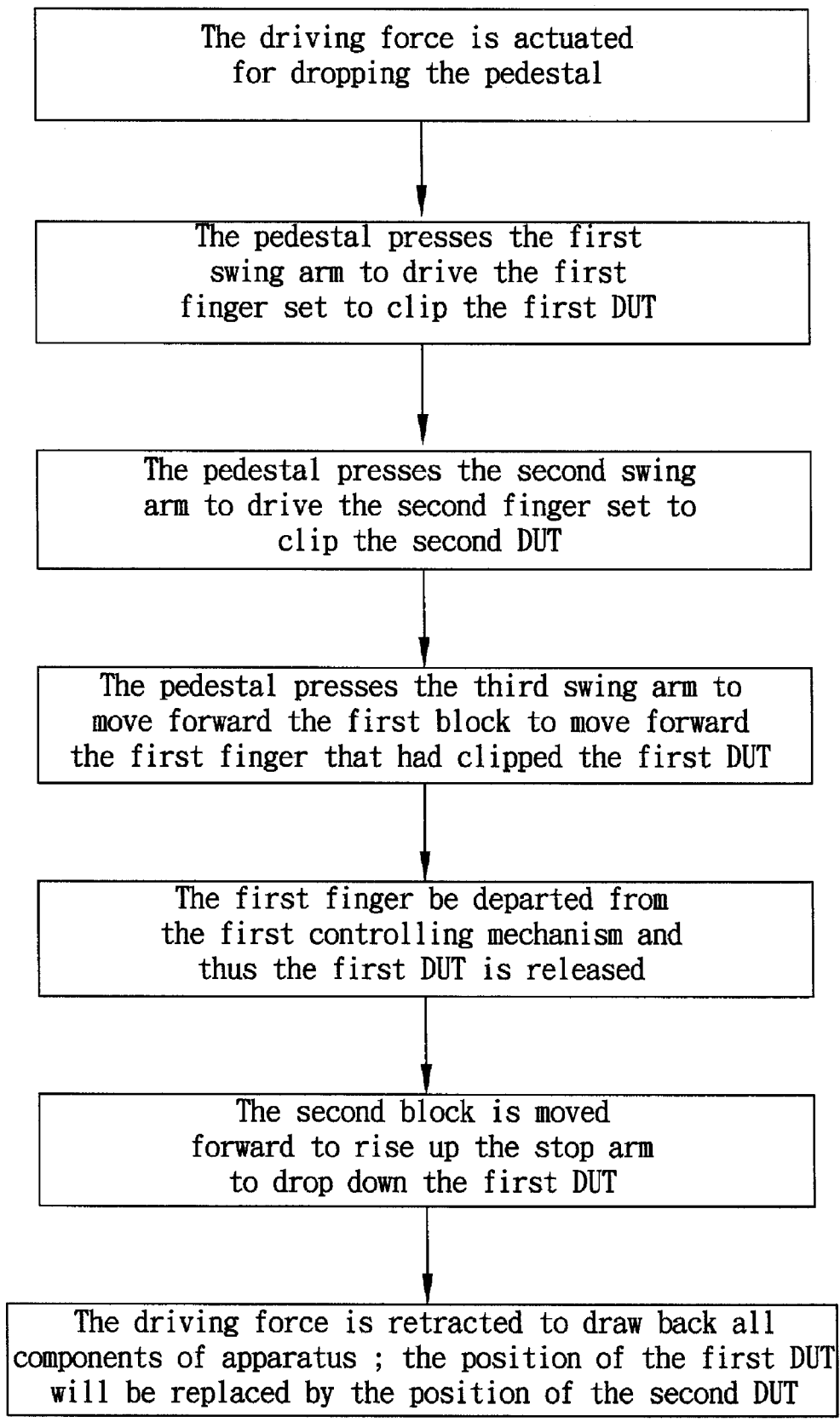
FIG. 5 is a flow chart describing segregating steps in accordance with the present invention.

The segregating process of one embodiment according to the present invention will be described in detail as follows with reference to FIG. 5:

(i) the driver 12 is actuated for dropping and pressing the upper support 14a, hence the upper support 14a will press the first press 14d via the first spring 14b and press the second press 14e via the second spring 14c.

Figure 6A:
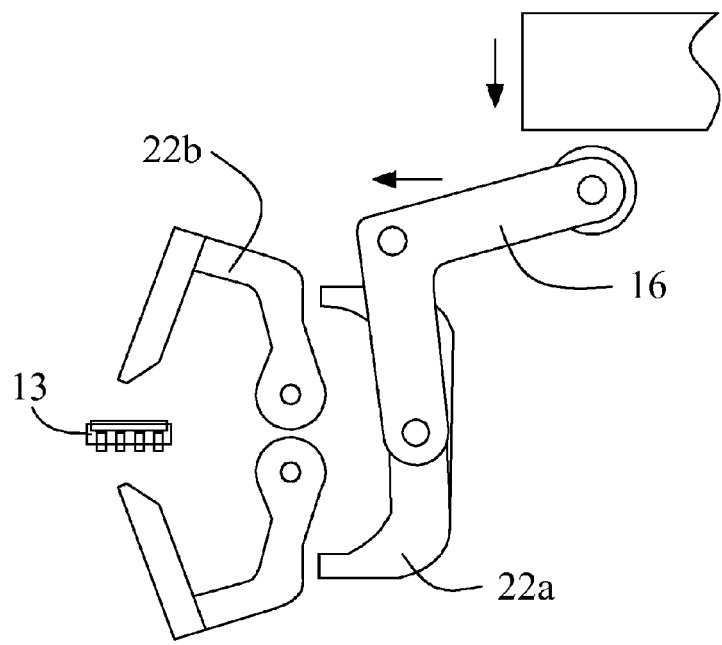
FIGS. 6A and 6B diagram clipping by a first controlling mechanism, driven by a first swing arm, of a first DUT according to the present invention.
Figure 6B:
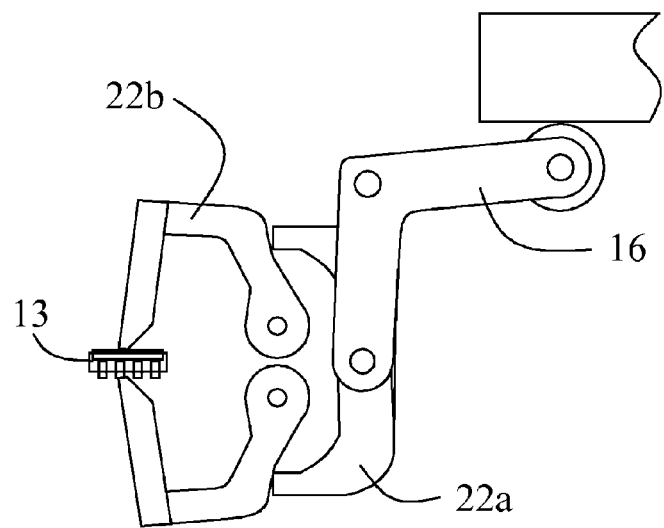

(ii) the first press 14d presses the first swing arm 16 first, so that a first DUT 13 (see FIG. 6B) will be clipped by the first finger 22b, which is driven by the first controlling mechanism 22a, which is driven by the first swing arm 16.

(iii) as the upper support 14 is still dropping, and similar to the first swing arm 16, the second press 14e presses the second swing arm 18, so that a second DUT (not shown) will be clipped by the second finger 24b, which is driven by the second controlling mechanism 24a, which is driven by the second swing arm 18.

(iv) as the upper support 14 is still dropping and thus pressing the third swing arm 20, the first block 28 is pushed forward to press the third spring 29a and the bolt 29b (see FIG. 4C), hence the first finger 22b is pushed forward via the bolt 29b; consequently the first DUT clipped by the first finger 22b and the second DUT which clipped by the second finger 24b will be separated while the first finger 22b is moving forward.

(v) the first finger 22b is moved forward and departed off the first controlling mechanism 22a, and thus the first finger 22b spreads and releases the first DUT.

(vi) in the meanwhile, the second block 30 is pushed forward to a predetermined position via the bolt 29b, the stop arm 26 mounted on the second block 30 will be departed from the hook 27 and be risen up, therefore the first DUT, released by the first finger, will slide down to the inspection zone, but the second DUT remains clipped by the second finger 24b.

(vii) the driver 12 is retracted; hence the first spring 14b, the second spring 14c, and the third spring 29a will be retracted due to the spring force and thus the components which coupled to the springs will be drawn back to original position, the second finger 24b will release the second DUT and the hook 27 will hook the stop arm 26 again, and the second DUT slides down and replaces the position of the first DUT but is stopped by the stop arm 26.

By repeating the steps as described above, the segregating process is continued.

According to the present invention, the segregating apparatus 10 for separating the DUTs is driven by only one driving force (e.g. driver); therefore the working space is reduced. In addition, the segregating process is capable of segregating continuously without switching to other drivers, and thus the process is simplified and accelerated. Moreover, because the DUTs can be separated by the finger 22b/24b even though they are linked together during the sealing process, the major cause of abnormal shut down is eliminated, and therefore the yield is increased.

While the invention has been described in conjunction with a specific mode, a number of variations may be made according to the present invention. For example, the controlling mechanism 22a/24a with the shape of a U, V, or the like is also practicable in other embodiments. Arranging the swing arms 16/18/20 in order of height is a possible alternative to replace the bumps 15/17. Moreover, it will be possible in other embodiments if the sequence being pressed is the second swing arm 18, the first swing arm 16, and the third swing arm 20, because the first DUT is still to be released first. Therefore, it will be appreciated by those skilled in the art that various modifications, alternatives and variations may be made without departing from the scope of the present invention, which is intended to be limited solely by the appended claims.

What is claimed is:

1. A segregating apparatus, comprising:
a stop arm installed in one side of said segregating apparatus for controlling a first electronic component or a second electronic component to be stopped in said segregating apparatus or not;
a first finger set installed behind said stop arm for clipping said first electronic component;
a first swing arm installed behind said first finger set for driving said first finger set;
a second finger set installed behind said first finger set for clipping said second electronic component;
a second swing arm installed behind said second finger set for driving said second finger set;
a first block installed behind said first swing arm;
a second block installed beside said first finger set for controlling said stop arm, said first block being coupled to said second block for pushing said first finger and said second block;
a third swing arm installed behind said first block for driving said first block;
a pedestal mounted above said first swing arm, said second swing arm, and said third swing arm for driving said first swing arm, said second swing arm, and said third swing arm; and
a driving force mounted above said pedestal for driving said pedestal;
wherein said driving force drives said pedestal to press said first swing arm, said second swing arm, and said third swing arm in sequence, and wherein said first swing arm drives said first finger set to clip said first electronic component, said second swing arm drives said second finger set to clip said second electronic component, said third swing arm pushes the first block and thus said first finger moving forward to separate said first electronic component and said second electronic component, said first block pushes said first finger moving further forward to release said first electronic component, and said first block pushes said second block moving forward to rise said stop arm and thus allow said first electronic component out of said segregating apparatus.

2. The segregating apparatus as set forth in claim 1, wherein said driving force comprises a pneumatic piston.

3. The segregating apparatus as set forth in claim 1, wherein said pedestal comprises:
an upper support coupled to said driving force;
a first press mounted under said upper support for pressing said first swing arm and said third swing arm;
a second press mounted under said upper support for pressing said second swing arm;
a first spring mounted between said upper support and said first press; and
a second spring mounted between said upper support and said second press; wherein said first spring and said second spring supply a spring force for drawing said pedestal back to the original position while said driving force is retracted.

4. The segregating apparatus as set firth in claim 3, further comprising a first bump located between said first swing arm and said first press.

5. The segregating apparatus as set forth in claim 3, further comprising a second bump located between second swing arm and said second press.

6. The segregating apparatus as set forth in claim 1, wherein said first finger set comprises a first controlling mechanism and a first finger coupling to said first swing arm.

7. The segregating apparatus as set forth in claim 6, wherein said first swing arm drives said first controlling mechanism moving forward for controlling said first finger to clip together.

8. The segregating apparatus as set forth in claim 6, wherein said first controlling mechanism has an inverted U shape.

9. The segregating apparatus as set forth in claim 6, wherein said first controlling mechanism has a shape of a V.

10. The segregating apparatus as set forth in claim 1, wherein said second finger set comprises a second controlling mechanism and a second finger coupling to said second swing arm.

11. The segregating apparatus as set forth in claim 10, wherein said second swing arm drives said second controlling mechanism moving forward for controlling said second finger to clip together.

12. The segregating apparatus as set forth in claim 10, wherein said second controlling mechanism has an inverted U shape.

13. The segregating apparatus as set forth in claim 10, wherein said second controlling mechanism has a shape of a V.

14. The segregating apparatus as set forth in claim 1, further comprising a third spring mounted between said first block and said second block for drawing back said second block to an original position while said driving force is retracted.

15. The segregating apparatus as set forth in claim 1, further comprising a bolt coupling together said first block, said first finger, and said second block for drawing back to an original position while said driving force is retracting.

16. The segregating apparatus as set forth in claim 1, further comprising a hook mounted above said stop arm for controlling said stop arm.

17. The segregating apparatus as set forth in claim 1, wherein the distance between said pedestal and said first swing arm is larger than the distance between said pedestal and said second swing arm.

18. The segregating apparatus as set forth in claim 17, wherein the distance between said pedestal and said third swing arm is larger than the distance between said pedestal and said first swing arm.

19. The segregating apparatus as set forth in claim 1, wherein the distance between said pedestal and said second swing arm is larger than the distance between said pedestal and said first swing arm.

20. The segregating apparatus as set forth in claim 19, wherein the distance between said pedestal and said third swing arm is larger than the distance between said pedestal and said second swing arm.

* * * * *